(12) United States Patent
Agrawal

(10) Patent No.: US 7,013,437 B2
(45) Date of Patent: Mar. 14, 2006

(54) HIGH DATA RATE DIFFERENTIAL SIGNAL LINE DESIGN FOR UNIFORM CHARACTERISTIC IMPEDANCE FOR HIGH PERFORMANCE INTEGRATED CIRCUIT PACKAGES

(75) Inventor: Amit P. Agrawal, Fremont, CA (US)

(73) Assignee: Broadcom Corporation, Irvine, CA (US)

( * ) Notice: Subject to any disclaimer, the term of this patent is extended or adjusted under 35 U.S.C. 154(b) by 188 days.

(21) Appl. No.: 10/602,734

(22) Filed: Jun. 25, 2003

(65) Prior Publication Data

US 2004/0268271 A1 Dec. 30, 2004

(51) Int. Cl.
G06F 17/50 (2006.01)

(52) U.S. Cl. .............................................. 716/1; 716/2

(58) Field of Classification Search ................ 716/1–2, 716/5; 333/12, 25–26, 32–34, 116
See application file for complete search history.

(56) References Cited

U.S. PATENT DOCUMENTS

| | | | | |
|---|---|---|---|---|
| 4,593,243 A | * | 6/1986 | Lao et al. ................... 324/754 |
| 5,138,287 A | * | 8/1992 | Domokos et al. ............. 333/12 |
| 6,621,370 B1 | * | 9/2003 | Dao ............................. 333/25 |
| 6,670,830 B1 | * | 12/2003 | Otsuka et al. ................. 326/86 |
| 6,677,831 B1 | * | 1/2004 | Cheng et al. ................. 333/34 |
| 6,677,832 B1 | * | 1/2004 | Guinn et al. ................. 333/116 |
| 6,845,492 B1 | * | 1/2005 | Frank et al. .................... 716/2 |
| 2002/0079983 A1 | * | 6/2002 | Leddige et al. ............... 333/34 |
| 2003/0095014 A1 | * | 5/2003 | Lao et al. ...................... 333/33 |
| 2003/0096447 A1 | * | 5/2003 | Lao et al. .................... 438/106 |

* cited by examiner

*Primary Examiner*—Matthew Smith
*Assistant Examiner*—Naum Levin
(74) *Attorney, Agent, or Firm*—Sterne, Kessler, Goldstein & Fox, P.L.L.C.

(57) ABSTRACT

Provided is an apparatus that includes an integrated circuit (IC) mounted on a chip carrier. The IC has one or more differential pair circuits coupled thereto and the chip carrier has a signal escaping portion and a remaining portion. The apparatus also includes differential signal lines coupled to the differential pair circuits, the differential signal lines (i) extending through the chip carrier and (ii) having first and second segments. The first segment extends through the escaping portion and the second segment extends through the remaining portion. The first and second segments have respective first and second widths.

20 Claims, 3 Drawing Sheets

HIGH DATA RATE DIFFERENTIAL SIGNAL LINE DESIGN FOR UNIFORM CHARACTERISTIC IMPEDANCE FOR HIGH PERFORMANCE INTEGRATED CIRCUIT PACKAGES

BACKGROUND OF THE INVENTION

1. Field of the Invention

The present invention relates generally to the field of integrated circuit (IC) design. In particular, the present invention relates to differential signal line design for multi giga-hertz GHz data rates on the high performance IC packages.

2. Related Art

For high pin-count packages, a significant challenge lies in escaping high data rate input/output (IO) differential signals from the IC, or die, to the package. In escaping these high data rate signals, a designer will preferably provide for escaping the signals without impacting signal integrity.

Using conventional techniques, signals are escaped from the die near the die-package interface with virtually no concern for signal integrity. This approach might be suitable for relatively low frequency signals, i.e., signals having data rates below one giga-bit per second (Gbps). But as the signal data rates increase, for example, beyond about 5 Gbps, the methodology for escaping the signals from the die becomes absolutely critical.

Because of limited space on the die, the signals are traditionally routed without concern for line factors such as characteristic impedance and the cross-talk between adjacent signal lines. Unfortunately, however, these factors degrade signal quality by producing unwanted reflections due to the impedance mismatches, and signal coupling between the adjacent lines.

What is needed, therefore, is a technique for escaping high data rate differential signals while, at the same time, maintaining signal integrity. More specifically, what is needed is a technique for providing substantially uniform impedances across all portions of the signal lines used to escape high data rate differential signals. Finally, what is needed is a technique that minimizes cross-talk between adjacent signal lines carrying the differential signals.

SUMMARY OF THE INVENTION

Consistent with the principles of the present invention as embodied and broadly described herein, an exemplary apparatus includes an integrated circuit (IC) mounted on a chip carrier. The IC has one or more differential pair circuits coupled thereto and the chip carrier has a signal escaping portion and a remaining portion. The apparatus also includes differential signal lines coupled to the differential pair circuits, the differential signal lines (i) extending through the chip carrier and (ii) having first and second segments. The first segment extends through the escaping portion and the second segment extends through the remaining portion. The first and second segments have respective first and second widths.

The present invention facilitates the design of signal lines suitable for transmitting high data-rate differential signal without inducing significant impacts to signal integrity. Signal lines that carry high data-rate differential signals are designed in a differential ended configuration. The characteristics impedance of the differential line pair, that transmits the signals, primarily depends on the line trace width, line spacing, and dielectric thickness. By properly varying the trace width and the spacing, the characteristic impedance will also vary.

In the present invention, the escape area of the differential signal line is designed to be, for example, about 100 ohms with a narrow trace width and narrow spacing between the signal lines. Particularly, the spacing between inverting and non-inverting paths of the differential signal line is selected such that the cross-talk is reduced to about 1% (−40 db). Beyond the escape area, the characteristic impedance can be maintained at about 100 ohms by increasing the trace width and line spacing. An advantage of increasing the trace width beyond the escape area is that the resistance of the line is reduced, ultimately reducing the insertion loss.

Further embodiments, features, and advantages of the present invention, as well as the structure and operation of the various embodiments of the present invention are described in detail below with reference to the accompanying drawings.

BRIEF DESCRIPTION OF THE FIGURES

The accompanying drawings, which are incorporated in and constitute part of the specification, illustrate embodiments of the invention and, together with the general description given above and the detailed description of the embodiments given below, serve to explain the principles of the present invention. In the drawings.

DETAILED DESCRIPTION OF THE INVENTION

The following detailed description of the present invention refers to the accompanying drawings that illustrate exemplary embodiments consistent with this invention. Other embodiments are possible, and modifications may be made to the embodiments within the spirit and scope of the invention. Therefore, the detailed description is not meant to limit the invention. Rather, the scope of the invention is defined by the appended claims.

It would be apparent to one of skill in the art that the present invention, as described below, may be implemented in many different embodiments of software, hardware, firmware, and/or the entities illustrated in the figures. Any actual software code with the specialized control of hardware to implement the present invention is not limiting of the present invention. Thus, the operational behavior of the present invention will be described with the understanding that modifications and variations of the embodiments are possible, given the level of detail presented herein.

Figure 1:
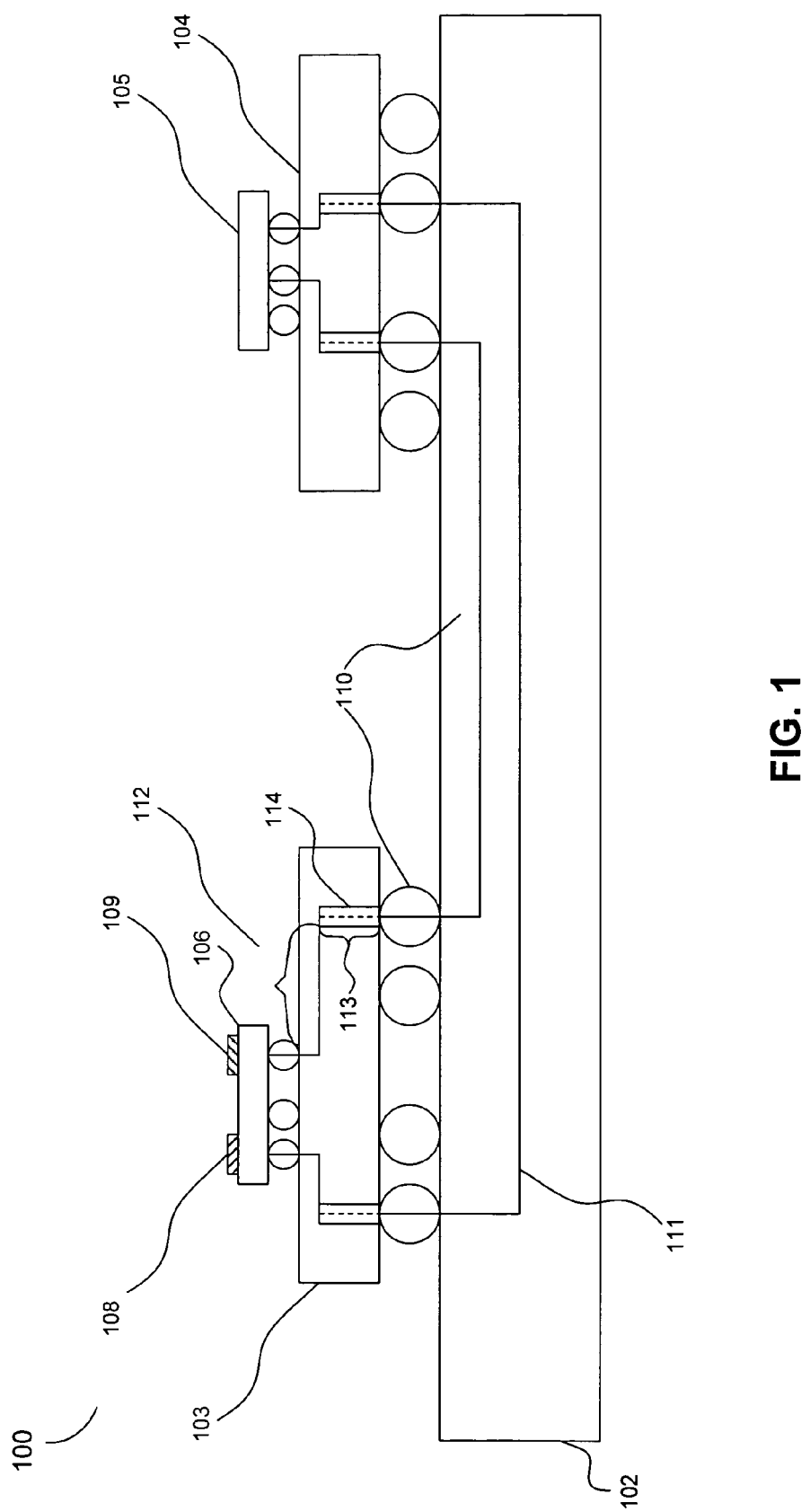
FIG. 1 is a top-level block diagram of an electrical circuit constructed and arranged in accordance with an embodiment of the present invention.

FIG. 1 is a top-level block diagram of an electrical circuit structured and arranged in accordance with the present invention. In FIG. 1, an electrical circuit 100 includes a printed circuit board (PCB) 102 and an electronic component package 103, or chip carrier, mounted on the PCB 102. A die 106 is electrically coupled to the package 103.

Differential circuit components 108 and 109 are formed within the die 106. The differential circuit components 108 and 109 could be, for example, differential drivers such as amplifiers. A signal transmission line 110 connects the differential circuit component 109 to the PCB 102, and in turn, to another package 104, also mounted on the PCB 102. The transmission line 110 further connects the package 104 to an additional die 105. The signal line 110 extends through an initial portion of the package 103 and then through a signal via 114 (remaining portion). Similarly, the transmission line 111 provides an electrical connection between the differential circuit component 108, the die 106, the package 103, the PCB 102, the package 104, and the die 105.

Figure 2:
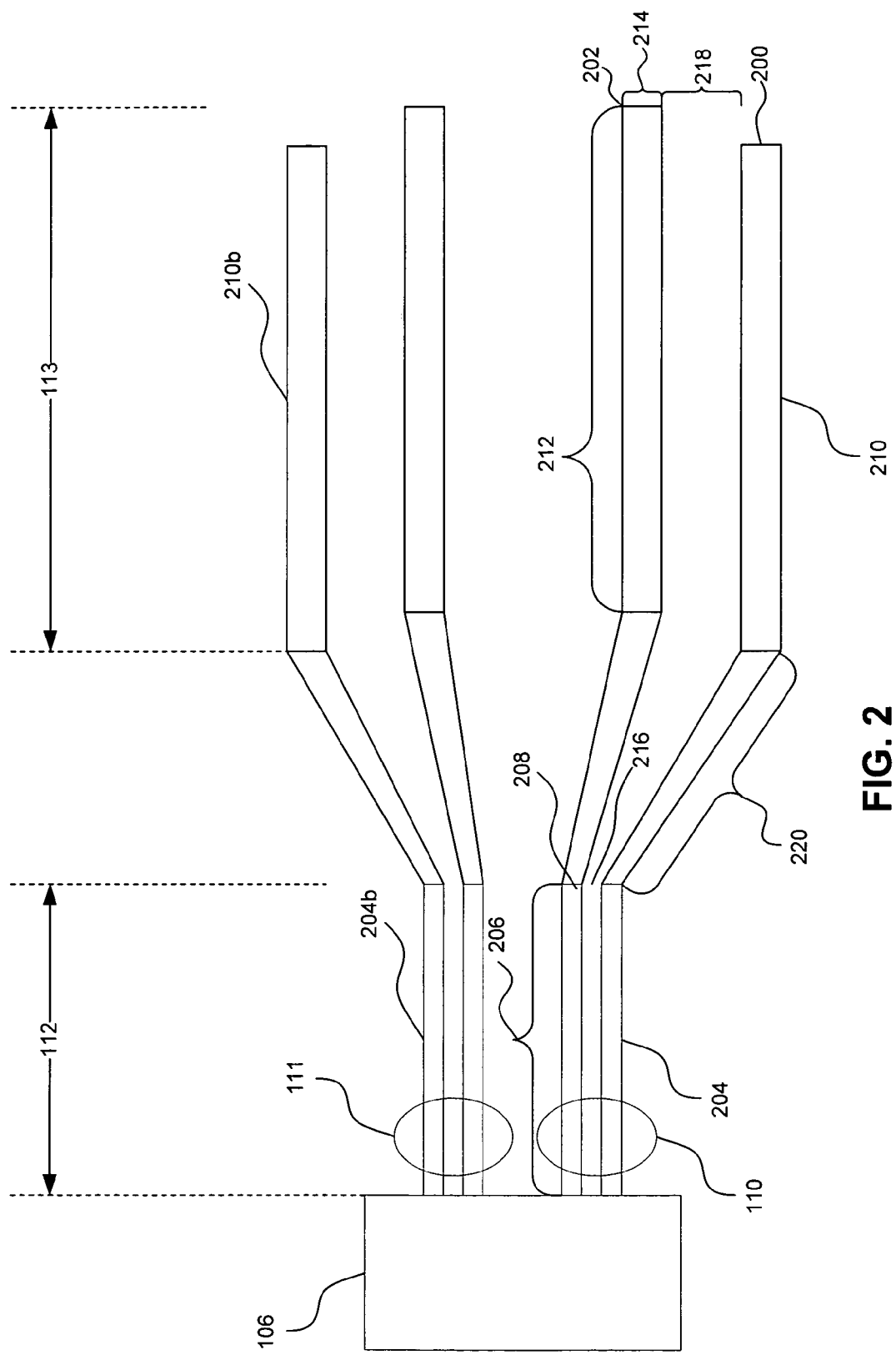
FIG. 2 is a more detailed view of the transmission lines shown in FIG. 1 above.

As known in IC design parlance, an escape area is an area within a package, such as the package 103, between the entry point of an electrical signal and the point at which the signal enters the signal via. In the present invention, as illustrated in FIG. 1, a portion 112 is the signal escape area. A portion 113 denotes the remaining portion within the package 103, wherein the signal line 110 is routed through the via 114 and then exited from the package 103. FIG. 2 provides a more detailed illustration of the die 106 and the associated signal lines 110 and 111 shown in FIG. 1.

As illustrated in FIG. 2 and noted above, the signal lines 110 and 111 share identical characteristics. Therefore, the techniques and features discussed with reference to the signal lines 110 are also applicable to the signal lines 111. The signal line 110 is shown in a differential-ended configuration having an inverting pathway 200 and a non-inverting pathway 202. Additionally, the line 110 includes a first segment 204, and a second segment 210. The inverting pathway 200 and the non-inverting pathway 202 are also respectively known as the negative and positive signal line sides.

The first segment 204 has a first length 206 and a first width 208. The second segment 210 has a second length 212 and a second width 214. Exemplary widths can include values within a range of about 25–100 microns ($\mu$m). The inverting path 200 and the non-inverting path 202 are adjacent to one another and are separated by a first spacing 216 and a second spacing 218, as shown in FIG. 2. Exemplary spacings can include values within a range of about 25–200 $\mu$m. A transition area 220 is provided where the first segment 204 transitions into the second segment 210.

In modern IC design, spacing between components, such as the differential components 108 and 109, is typically within a range of about 30–50 $\mu$m. And spacing within this range provides very restricted areas for escaping high data-rate signals from the die 106 to the electrical package 103. Subsequently, the signal lines in the escape areas are typically required to be narrow in order to physically conform to the limited space between the components. However, escaping high data-rate signals using narrow signal lines causes the resistance of the lines to be high. Another factor that contributes to this high resistance is the signal line length.

In conventional integrated circuit design, the differential signal lines are therefore narrow and maintain the same width and spacing throughout the electrical package. As the length of these conventional signal lines increases, the resistance increases, thus degrading the signal quality.

In the present invention, however, the signal lines 110 include at least the first segment 204 and the second segment 210, having different trace widths and different spacings. The segment 204 is narrow and escapes high data-rate differential signals from the escape area 112 of the package 113. The other segment 210 is wider and facilitates transmission of the signal through the remaining portion 113 of the package 103. Providing these multiple segments having varying widths and spaces provides a substantially uniform impedance across the entire length of the signal line 110 as it traverses the electrical package 103.

Precise values for widths 208 and 214 can be determined based upon the use of standard commercial turn-key modeling and simulation tools. Factoring in the dielectric properties of the segment 204 within the escape area 112, the characteristic impedance can be modeled to a variety of exemplary values, such as 100 ohms. As noted in FIG. 2, as the signal line 110 exits the escape area 112 and enters into the via 113, the dielectric width 214 and the spacing 218 are increased.

As the dielectric width 214 increases, the resistance in the segment 210 correspondingly decreases, subsequently reducing the insertion loss. By varying the widths 208 and 214 in this manner, a substantially uniform characteristic impedance can be achieved across these segments. In the present invention, the lengths 206 and 212 can also be determined through use of the turn-key modeling and simulation tools noted above.

Figure 3:
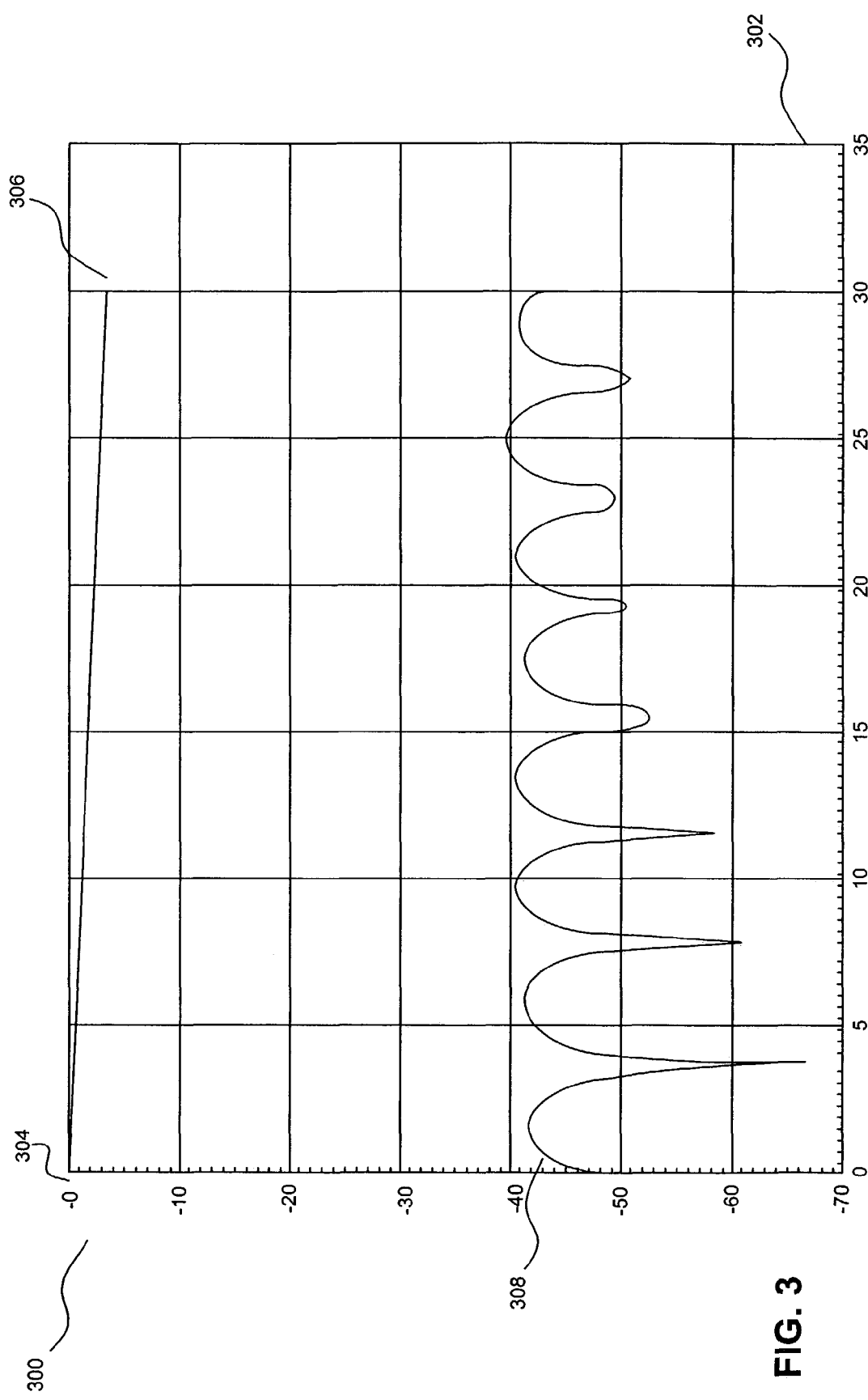
FIG. 3 is a graphical illustration of improved insertion loss and cross-talk, as provided through use of an embodiment of the present invention.

In similar fashion, cross-talk between the inverting and non-inverting paths 200 and 202 respectively, can be reduced by varying the path spacing 218 from the spacing 216 within the areas 112 and 113. Here again, standard off-the-shelf modeling and simulation tools can precisely determine the values of the spacings 216 and 218 as well as other line dimensions in order to maintain uniform impedance across the line 110. By varying these spacings, the cross-talk between the inverting and the non-inverting paths can be substantially reduced. FIG. 3 graphically illustrates the insertion loss and cross-talk achieved through implementation of an embodiment of the present invention.

FIG. 3 provides a graphic illustration 300 conveying frequency values 302 and amplitude values 304 of reductions in insertion loss 306 and cross-talk 308 provided by the present invention. In particular, FIG. 3 shows that as the data rates of the differential signal increases, the insertion loss for differential pairs realizes an improvement of 5–6 dB over the conventional techniques. In the example of FIG. 3, the improvement is illustrated as being most significant, for example, at about 30 GHz. FIG. 3 also conveys that the cross-talk between adjacent lines can be reduced to about −40 dB, providing about a 15–20 dB improvement in cross-talk over conventional techniques.

In the present invention, the signal lines through the package are designed to improve the overall integrity of high data-rate differential signals passed therethrough. This approach provides substantially uniform impedance throughout the length of the package, reducing insertion losses. The technique of the present invention also improves the impedance match to the drivers and the PCB traces, reduces cross-talk between the differential signal lines, and supports high-data rate signals with reduced jitter.

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed.

Any such alternate boundaries are thus within the scope and spirit of the claimed invention. One skilled in the art will recognize that these functional building blocks can be implemented by analog and/or digital circuits, discrete components, application specific integrated circuits, firmware, processors executing appropriate software and the like or any combination thereof. Thus, the breadth and scope of the present invention should not be limited by any of the above-described exemplary embodiments, but should be defined only in accordance with the following claims and their equivalents.

What is claimed is:

1. An apparatus comprising:
    an integrated circuit (IC) configured for attachment to a chip carrier, the IC having one or more differential pair circuits coupled thereto, the chip carrier (i) having a signal escaping portion and a remaining portion and (ii) being configured for mounting on a printed circuit board; and
    differential signal lines coupled to the differential pair circuits, the differential signal lines (i) extending through the chip carrier and (ii) having first and second segments;
    wherein the first segment extends through the escaping portion and the second segment extends through the remaining portion; and
    wherein the first and second segments have respective first and second widths.

2. The apparatus of claim 1, wherein the escaping portion is configured for escaping transmitted signals from the IC.

3. The apparatus of claim 1, wherein the first and second widths provide substantially uniform impedance characteristics across the signal lines.

4. The apparatus of claim 3, wherein the impedance is within a range of about 90 to 110 ohms.

5. The apparatus of claim 1, wherein the second width is larger than the first width.

6. The apparatus of claim 1, wherein the differential signal lines include respective inverting and non-inverting paths; and
    wherein the paths along the escaping portion are separated by a first spacing and the paths along the remaining portion are separated by at least a second spacing.

7. The apparatus of claim 6, wherein the second spacing is larger that the first spacing.

8. The apparatus of claim 6, wherein the first and second spacings cooperate to reduce cross-talk between the inverting and non-inverting paths.

9. The apparatus of claim 6, wherein the first and second widths and the first and second spacings are determined based upon modeling and simulations.

10. The apparatus of claim 6, wherein the inverting and non-inverting paths are adjacent to one another.

11. The apparatus of claim 1, wherein the signal lines are configured to transmit high data rate signals.

12. The apparatus of claim 11, wherein a data rate of the high data rate signals is greater than or equal to about 5 gigabits per second.

13. A chip carrier configured for (i) mounting on a printed circuit board, and (ii) attachment to an integrated circuit (IC), the IC having a differential circuit coupled thereto, the chip carrier including a signal escaping portion and a remaining portion, comprising:
    differential signal lines extending through the chip carrier and including first and second segments;
    wherein the first segment extends through the signal escaping portion and the second segment extends through the remaining portion;
    wherein the first and second segments have respective first and second widths; and
    wherein the first and second widths provide substantially uniform impedance characteristics across the signal lines.

14. The chip carrier of claim 13, wherein the first and second widths provide substantially uniform impedance characteristics across the signal lines.

15. The chip carrier of claim 13, wherein the second width is larger than the first width.

16. The chip carrier of claim 13, wherein the differential signal lines include respective inverting and non-inverting paths; and
    wherein the paths along the escaping portion are separated by a first spacing and the paths along the remaining portion are separated by at least a second spacing.

17. The chip carrier of claim 16, wherein the second spacing is larger that the first spacing.

18. The chip carrier of claim 17, wherein the first and second spacings cooperate to reduce cross-talk between the inverting and non-inverting paths.

19. The chip carrier of claim 18, wherein the first and second widths and the first and second spacings are determined based upon modeling and simulations.

20. The chip carrier of claim 13, wherein the signal lines are configured to transmit signals having a data-rate greater than about 5 gigabits per second.

* * * * *